US00RE47709E

(19) United States
(12) Reissued Patent
Hsieh et al.

(10) Patent Number: US RE47,709 E
(45) Date of Reissued Patent: Nov. 5, 2019

(54) FORMING GROUNDED THROUGH-SILICON VIAS IN A SEMICONDUCTOR SUBSTRATE

(71) Applicant: Taiwan Semiconductor Manufacturing Company, Ltd., Hsin-Chu (TW)

(72) Inventors: Chi-Chun Hsieh, Taipei (TW); Wei-Cheng Wu, Hsin-Chu (TW); Hsiao-Tsung Yen, Tainan (TW); Hsien-Pin Hu, Zhubei (TW); Shang-Yun Hou, Jubei (TW); Shin-Puu Jeng, Hsin-Chu (TW)

(73) Assignee: Taiwan Semiconductor Manufacturing Company, Ltd., Hsinchu (TW)

(21) Appl. No.: 15/336,265

(22) Filed: Oct. 27, 2016

Related U.S. Patent Documents

Reissue of:
(64) Patent No.: 8,872,345
Issued: Oct. 28, 2014
Appl. No.: 13/178,079
Filed: Jul. 7, 2011

(51) Int. Cl.
*H01L 21/283* (2006.01)
*H01L 23/48* (2006.01)
*H01L 21/74* (2006.01)

(52) U.S. Cl.
CPC ..... *H01L 23/481* (2013.01); *H01L 21/743* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,391,917 | A | 2/1995 | Gilmour et al. |
| 5,510,298 | A | 4/1996 | Redwine |
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |

(Continued)

FOREIGN PATENT DOCUMENTS

| | | |
|---|---|---|
| JP | 2005243689 | 9/2005 |
| JP | 2005243689 A | 9/2005 |

*Primary Examiner* — Sean E Vincent
(74) *Attorney, Agent, or Firm* — Slater Matsil, LLP

(57) ABSTRACT

A method of forming an interposer includes providing a semiconductor substrate, the semiconductor substrate having a front surface and a back surface opposite the front surface; forming one or more through-silicon vias (TSVs) extending from the front surface into the semiconductor substrate; forming an inter-layer dielectric (ILD) layer overlying the front surface of the semiconductor substrate and the one or more TSVs; and forming an interconnect structure in the ILD layer, the interconnect structure electrically connecting the one or more TSVs to the semiconductor substrate.

74 Claims, 3 Drawing Sheets

(56) References Cited

U.S. PATENT DOCUMENTS

| | | | | |
|---|---|---|---|---|
| 6,800,930 | B2 | 10/2004 | Jackson et al. | |
| 6,841,883 | B1 | 1/2005 | Farnworth et al. | |
| 6,882,030 | B2 | 4/2005 | Siniaguine | |
| 6,924,551 | B2 | 8/2005 | Rumer et al. | |
| 6,962,867 | B2 | 11/2005 | Jackson et al. | |
| 6,962,872 | B2 | 11/2005 | Chudzik et al. | |
| 7,030,481 | B2 | 4/2006 | Chudzik et al. | |
| 7,049,170 | B2 | 5/2006 | Savastiouk et al. | |
| 7,060,601 | B2 | 6/2006 | Savastiouk et al. | |
| 7,071,546 | B2 | 7/2006 | Fey et al. | |
| 7,111,149 | B2 | 9/2006 | Eilert | |
| 7,122,912 | B2 | 10/2006 | Matsui | |
| 7,157,787 | B2 | 1/2007 | Kim et al. | |
| 7,193,308 | B2 | 3/2007 | Matsui | |
| 7,262,495 | B2 | 8/2007 | Chen et al. | |
| 7,297,574 | B2 | 11/2007 | Thomas et al. | |
| 7,335,972 | B2 | 2/2008 | Chanchani | |
| 7,355,273 | B2 | 4/2008 | Jackson et al. | |
| 7,846,837 | B2 * | 12/2010 | Kuo | 438/667 |
| 7,932,175 | B2 * | 4/2011 | Chatterjee | H01L 21/76898 257/E21.496 |
| 7,968,460 | B2 * | 6/2011 | Kirby | H01L 21/743 438/667 |
| 8,299,583 | B2 * | 10/2012 | Zhu | 257/621 |
| 8,404,587 | B2 * | 3/2013 | Kirby et al. | 438/667 |
| 2003/0178389 | A1 | 9/2003 | Yuasa | |
| 2005/0017333 | A1 * | 1/2005 | Bohr | 257/678 |
| 2007/0184654 | A1 * | 8/2007 | Akram et al. | 438/675 |
| 2007/0289127 | A1 * | 12/2007 | Hurwitz et al. | 29/827 |
| 2008/0318361 | A1 * | 12/2008 | Han | H01L 21/76898 438/109 |
| 2010/0237386 | A1 * | 9/2010 | Lin | H01L 23/481 257/173 |
| 2012/0080802 | A1 * | 4/2012 | Cheng | H01L 23/481 257/774 |
| 2012/0135566 | A1 * | 5/2012 | Pinguet et al. | 438/107 |

* cited by examiner

FORMING GROUNDED THROUGH-SILICON VIAS IN A SEMICONDUCTOR SUBSTRATE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 8,872,345.*

FIELD

The disclosure relates generally to the fabrication of semiconductor devices and, more particularly, to a method of forming grounded through-silicon vias in a semiconductor substrate.

BACKGROUND

Interposers are used for integrated circuit packaging, typically for space transformation, which is for routing connections between semiconductor dies and packaging components. FIG. 1 illustrates a cross-sectional view of a portion of an interposer 10. Usually, interposer 10 includes a substrate 30, which is typically formed of organic materials or ceramics. One or more through-silicon vias (TSVs) 50 are formed in the substrate 30 for making electrical connections from one or more semiconductor dies and/or packaging components (not shown).

With the increasing scaling down of integrated circuits and increasing circuit functionality there is an increased demand for progressively smaller linewidths on the interposer. As linewidths shrink, RC transmission line effects increase due to loading from die/die package resistance, inductance, and/or capacitance. Moreover, as substrate 30 is not grounded cross coupling or cross talk between adjacent TSVs increases as well. Due to this cross-coupling between TSVs, signals traveling along relatively long interconnections suffer delays and other forms of distortion. As a result, these signals may become corrupted, slowing operation of integrated circuits or even causing failure. These effects are more pronounced as operating frequencies increase.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 2-6 are cross-sectional views of a portion of an interposer 20 at various stages of fabrication according to an exemplary embodiment of the present disclosure. It is understood that FIGS. 2-6 have been simplified for a better understanding of the inventive concepts of the present disclosure.

Figure 1:
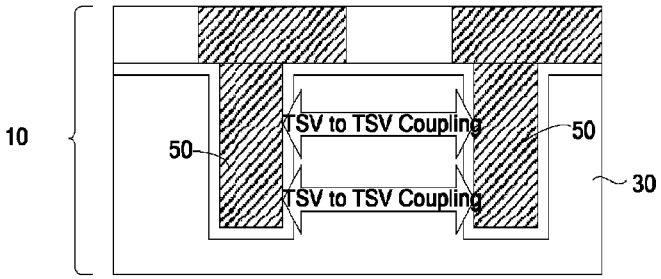
FIG. 1 is a cross-sectional view of a portion of an interposer showing the problem of low signal integrity resulting from TSV to TSV coupling.
Figure 2:
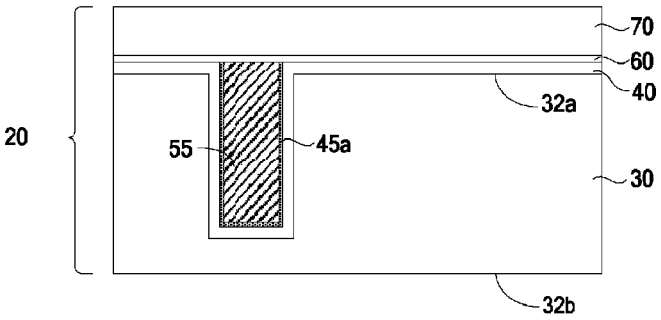
FIGS. 2-6 are cross-sectional views of a portion of an interposer at various stages of fabrication according to an exemplary embodiment of the present disclosure.

Referring to FIG. 2, the interposer 20 includes a substrate 30 having a front surface 32a and a back surface 32b opposite the front surface 32a. Substrate 30 is formed of silicon, although other semiconductor materials including group III, group IV, group V elements and silicon germanium (SiGe) may also be used. In alternative embodiments, substrate 30 contains commonly used materials such as inorganic and organic materials, ceramics, and/or multilayers thereof.

In an embodiment to form a TSV opening that extends from front surface 32a into a portion of the substrate 30, a photoresist layer (not shown) is spin coated over the front surface 32a of substrate 30. The photoresist layer is then patterned by exposure, bake, development, and/or other photolithography processes using the patterned photoresist layer as a masking element to form the TSV opening passing through a portion of the substrate 30. In some embodiments, the TSV opening may be etched using any suitable etching method including, for example, plasma etch, a chemical wet etch, a laser drill, and/or other suitable processes. In an embodiment, the etching process includes a deep reactive ion etching (RIF) process to etch the substrate 30. The etching process may result in an opening having a vertical sidewall profile or a tapered sidewall profile.

In another embodiment of forming an opening that is a TSV opening, a photoresist layer (not shown) may be formed on a hard mask layer (not shown). The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 30 forming the TSV opening.

A Liner layer 40 is thereafter formed over substrate 30. Liner layer 40 is conformally deposited on the front surface 32a of the substrate 30 and along the sidewalls and bottom of the TSV opening in order to prevent any conducting material from leaching into substrate 30. In some embodiments, the liner layer 40 may be formed of silicon oxide, TEOS (tetraethylorthosilicate) oxide, silicon nitride, polyimide, combinations thereof, or the like. The deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition), and other suitable deposition procedures. For example, an LPCVD or PECVD process with TEOS and $O_3$ may be employed to form a TEOS oxide film.

Still referring to FIG. 2, a barrier layer 45a is then formed on the liner layer 40, lining the TSV opening. The barrier layer 45a functions as a diffusion barrier to prevent metal diffusion and as an adhesion layer between metal and dielectric. In some embodiments, refractory metals, refractory metal-nitrides, refractory metal-silicon-nitrides, or combinations thereof are typically used for the barrier layer 45a. For example, TaN, Ta, Ti, TiN, TiSiN, WN, or combinations thereof may be used. In an embodiment, the barrier layer 45a includes a TaN layer and a Ta layer, in another embodiment, the barrier layer 45a is a TiN layer. In yet another embodiment, the barrier layer 45a is a Ti layer. The barrier layer 45a can be formed using PVD (physical vapor deposition), sputtering, or the like. Subsequently, a metal seed layer (not shown) is formed on the barrier layer 45a. In an embodiment, the metal seed layer is a copper seed layer that may be formed by PVD (physical vapor deposition) sputtering, electro plating, or electroless plating. In some embodiments, other methods for forming the copper seed layer, such as CVD (chemical vapor deposition), are used.

Next, a conductive material layer is deposited on the interposer 20 to fill the TSV opening thereby forming a conductive plug 55. Throughout the description, the conductive plug 55 is referred to as a through-silicon-via (TSV). The conductive material layer may include a low resistivity conductor material selected from the group of conductor materials including, but is not limited to, copper and copper-based alloy. In some embodiments, the conductive material layer may comprise various materials, such as tungsten, aluminum, gold, silver, titanium, or the like. The formation methods may include sputtering, printing, electroplating, electroless plating, and/or chemical vapor deposition (CVD) methods.

Subsequently, the excess portions of the conductive material layer outside the [ISV] *TSV* opening are removed, either through etching, chemical mechanical polishing (CMP), or the like, having the upper surface of the conductive plug 55 substantially coplanar with the upper surface of the liner layer 40.

One or more etch stop layers 60 may optionally be formed over interposer 20. Generally, the etch stop layers provide a mechanism to stop an etching process when forming vias and/or contacts. In some embodiments etch stop layer 60 is formed of a dielectric material having a different etch selectivity from adjacent layers, e.g., the underlying liner layer 40, the substrate 30, and an overlying ILD layer 70. In an embodiment, etch stop layer 60 may be formed of SiN, SiON, ON, combinations thereof, or the like, deposited by CVD or PECVD techniques.

Still referring to FIG. 2, the inter-layer dielectric (ILD) layer 70 is formed on the front surface 32a of substrate 30 over the liner layer 40 and the etch stop layer 60. The ILD layer 70 isolates the TSV 55 from a subsequent formation of interconnection structure. The ILD layer 70 may be a single layer or a multi-layered structure. In some embodiments, the ILD layer 70 may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). In some alternative embodiments, the ILD layer 70 may be formed of doped or P-doped spin-on-glass (SOG), phosphosilicate TEOS (PTEOS), or borophosphosilicate TEOS (BPTEOS).

Figure 3:
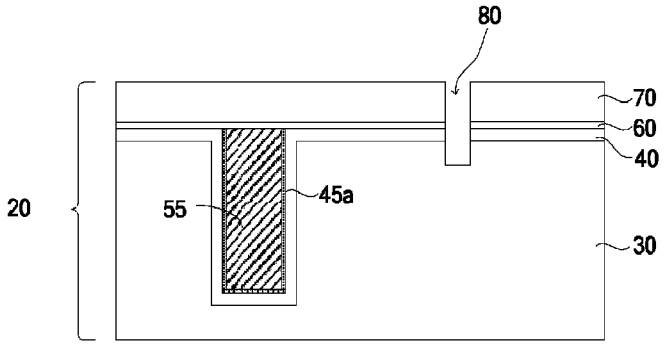

An interconnect structure electrically connecting the [ISV] *TSV* with the substrate 30 will now be described with reference to FIGS. 3-6. With reference to FIG. 3, a via opening 80 is formed extending from the ILD layer 70 into a portion of the substrate 30. In some embodiments, via opening 80 may be formed by firstly coating a photoresist layer (not shown) on ILD layer 70. The photoresist layer is then patterned by exposure, bake, development, and/or other photolithography processes using the patterned photoresist layer as a masking element to form the via opening. In some embodiments, the via opening 80 may be etched using any suitable etching method including, for example, a plasma etch, a chemical wet etch, a laser drill, and/or other processes. The etching process may result in an opening having a vertical sidewall profile or a tapered sidewall profile.

In another embodiment of forming an opening that is a via opening, a photoresist layer (not shown) may be formed on a hard mask layer (not shown). The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 30 forming the via opening.

Figure 4:
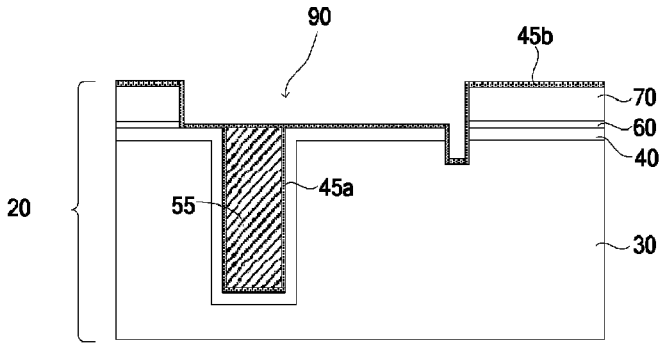

A trench opening 90, shown in FIG. 4, is then formed in the ILD layer 70 in a similar fashion as forming the via opening 80 above and hence the process will not be repeated herein. The trench opening 90 exposes a portion of the TSV 55 so that in a subsequent step a conductive material layer will be deposited on interposer 20, said conductive material layer forming an interconnect structure that connects TSV 55 with substrate 30. A barrier layer 45b may be formed over interposer 20, in the via opening 80 and the trench opening 90. A seed layer (not shown) may be subsequently formed over the barrier layer 45b. Both the materials and processes used for forming the barrier layer 45b and the seed layer was previously described above with reference to FIG. 2 and will therefore not be described again.

Figure 5:
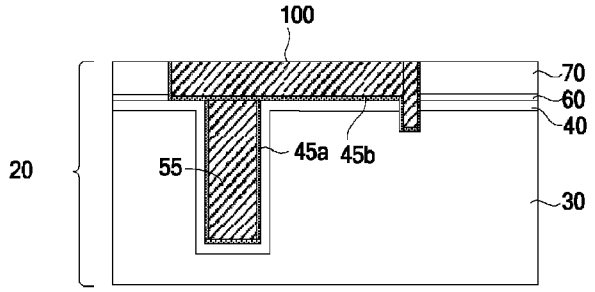

Referring to FIG. 5, the interposer 20 is transferred to a plating tool, such as an electrochemical plating (ECP) tool, and a conductive material layer is plated on the interposer 20 by the plating process to fill the via opening 80 and the trench opening 90 to form an interconnect structure 100. While the ECP process is described therein, the embodiment is not limited to ECP deposited metal. The conductive material layer may include a low resistivity conductor material selected from the group of conductor materials including, but is not limited to, copper and copper-based alloy. In some embodiments, the conductive material layer 80 may comprise various materials, such as tungsten, aluminum, gold, silver, or the like. This electroplating process forms a void-free metallization structure to provide a reliable solution. Other methods for depositing a conductive material layer in via opening 80 and trench opening 90 are also contemplated.

Following the depositing of the conductive material layer, the upper surface of interposer 20 undergoes a planarization step. Excess portions of the conductive material layer outside the via and trench openings are removed, either through etching, chemical mechanical polishing (CMP), or the like, having the upper surface of the interconnect structure 100 substantially coplanar with the upper surface of the ILD layer 70.

Advantageously, interposer 20 may be easily customized to suit different requirements. In an exemplary embodiment, an active or passive device (not shown) is embedded into the interposer 20, wherein the active or passive device may include capacitors, resistors, and the like.

It is understood that additional processes may be performed to complete the fabrication of interposer 20 to form various features for implementation in a semiconductor package structure. Subsequent fabrication processing may further form features such as metal lines, connecting vias, dielectric layers, bonding pads, or solder bumps configured to connect the various features or structures of interposer 20 to one or more semiconductor chips. In an exemplary embodiment, a semiconductor chip can be bonded onto interposer 20 with a plurality of bonding pads. One skilled in the art will realize the corresponding bonding process steps. In another exemplary embodiment, a multi-chip structure having at least two semiconductor chips can be bonded onto interposer 20. According to one embodiment, the at least two chips are bonded together before they are bonded onto interposer 20. Alternatively, a first chip is bonded onto interposer 20 first, and then the second chip is bonded onto the first chip.

Figure 6:
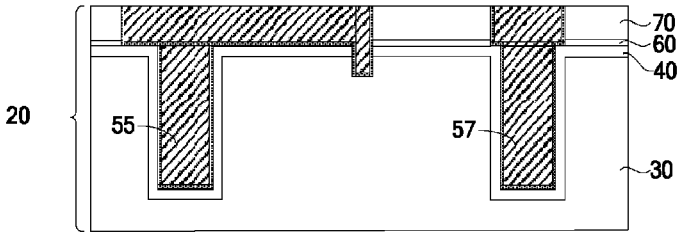

*FIG. 6 illustrates another embodiment in which the conductive plug 55 is utilized along with another conductive plug 57, which may also be another through-silicon via (TSV) or another through-via (TV) in those circumstances when the substrate 30 is a non-silicon material. In this embodiment the another conductive plug 57 may be similar to the conductive plug 55, and may be insulated from the substrate 30 by the line layer 40.*

According to one embodiment, a method of forming a semiconductor device comprises providing a semiconductor substrate, the semiconductor substrate having a first side and a second side opposite the first side; forming a through-silicon via (TSV) opening extending from the first side of the semiconductor substrate into the semiconductor substrate; forming a liner layer on the first side of the semiconductor substrate and along the [sidewalk] *sidewall* and bottom of the TSV opening; depositing a first conductive material layer over the liner layer in the opening to form a TSV; forming an [interlayer] *inter-layer* dielectric (ILD) layer over the first side of the semiconductor substrate; forming a via opening extending from the ILD layer into a portion of the semiconductor substrate; forming a trench opening in the [IUD] *ILD* layer to expose a portion of the ISV; and depositing a second conductive material layer in the via and the trench openings to form an interconnect structure, the interconnect structure electrically connecting the TSV with the semiconductor substrate.

According to another embodiment, a method of forming an interposer comprises providing a semiconductor substrate, the semiconductor substrate having a front surface and a back surface opposite the front surface; forming one or more through-silicon vias (TSVs) extending from the front surface into the semiconductor substrate; forming an inter-layer dielectric (ILD) layer overlying the front surface of the semiconductor substrate and the one or more TSVs; and forming an interconnect structure having a first partition and a second partition, the first partition formed in the ILD layer and the second partition formed in a portion of the semiconductor substrate, wherein the interconnect structure electrically connects the one or more TSVs to the semiconductor substrate.

According to yet another embodiment, an integrated circuit structure comprises a semiconductor substrate having a front surface and a hack surface opposite the front surface; a TSV formed extending from the front surface of the semiconductor substrate into the semiconductor substrate; and an interconnect structure having a first partition and a second partition, the first partition formed in an ILD layer, the ILD layer overlying the front surface of the semiconductor substrate and the second partition formed in a portion of the semiconductor substrate, wherein the interconnect structure electrically connects the TSV to the semiconductor substrate.

According to yet another embodiment, an interposer comprises a semiconductor substrate having a front surface and a back surface opposite the front surface; a TSV formed extending from the front surface of the semiconductor substrate into the semiconductor substrate; a liner layer formed at least between the TSV and the semiconductor substrate; an ILD layer formed over the front surface of the semiconductor substrate; and an interconnect structure having a first partition and a second partition, the first partition formed in the ILD layer and the second partition formed in a portion of the semiconductor substrate. Wherein the interconnect structure electrically connects the TSV to the semiconductor substrate.

According to yet still another embodiment, a semiconductor package structure comprises an interposer having a semiconductor substrate having a front surface and a back surface opposite the front surface; a TSV formed extending from the front surface of the semiconductor substrate into the semiconductor substrate; a liner layer formed at least between the TSV and the semiconductor substrate; an ILD layer formed over the front surface of the semiconductor substrate; and an interconnect structure having a first partition and a second partition, the first partition formed in the ILD layer and the second partition formed in a portion of the semiconductor substrate, wherein the interconnect structure electrically connects the TSV to the semiconductor substrate. The package structure further comprises a semiconductor chip; and a plurality of bonding pads bonding the semiconductor chip to the interposer.

According to yet another embodiment, a semiconductor package structure comprises an interposer having: a semiconductor substrate having a front surface and a back surface opposite the front surface; a TSV formed extending from the front surface of the semiconductor substrate into the semiconductor substrate; a liner layer formed at least between the TSV and the semiconductor substrate; an ILD layer formed over the front surface of the semiconductor substrate; and an interconnect structure having a first partition and a second partition, the first partition formed in the ILD layer and the second partition formed in a portion of the semiconductor substrate. Wherein the interconnect structure electrically connects the TSV to the semiconductor substrate. The package structure further comprises a multi-chip semiconductor structure having at least a first chip and a second chip; and a plurality of bonding pads bonding the semiconductor structure to the interposer.

One or more of the embodiments of the present disclosure discussed above have advantages over existing methods. It is understood, however, that other embodiments may have different advantages, and that no particular advantage is required for all embodiments.

One of the advantages is that as TSV 55 is grounded (e.g., TSV 55 is electrically connected to substrate 30), cross coupling and cross talk between adjacent TSVs can be minimized. By having the TSVs grounded, resistive-capacitive delays that hinder further increasing of speed in microelectronic integrated circuits are minimized and signal integrity is thereby improved. Further, as an added benefit, a grounded TSV provides for better heat dissipation, especially in micro-electronic ICs having smaller and smaller feature sizes. As a further advantage by grounding the TSV, charge build-up on electrostatic discharge (ESD) sensitive integrated circuits from an ESD event is prevented, thus reducing damage to the integrated circuit.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of forming a semiconductor device, comprising:

providing a semiconductor substrate, the semiconductor substrate having a first side and a second side opposite the first side;

forming a through-silicon via (TSV) opening extending from the first side of the semiconductor substrate into the semiconductor substrate;

forming a liner layer on the first side of the semiconductor substrate and along the sidewalls and bottom of the TSV opening;

depositing a first conductive material layer over the liner layer in the opening to form a TSV;

forming an inter-layer dielectric (ILD) layer over the first side of the semiconductor substrate;

forming a via opening extending from the ILD layer into a portion of the semiconductor substrate;

forming a trench opening in the ILD layer to expose a portion of the TSV; and depositing a second conductive material layer in the via and the trench openings to form an interconnect structure, the interconnect structure electrically connecting the TSV with the semiconductor substrate.

2. The method of claim 1, wherein the semiconductor device is an interposer.

3. The method of claim 1, after the forming the TSV, further comprising planarizing the first side of the semiconductor substrate.

4. The method of claim 1, further comprising forming a first barrier layer between the liner layer and the TSV.

5. The method of claim 4, further comprising forming a first seed layer between the first barrier layer and the TSV.

6. The method of claim 1, before the forming the ILD layer over the first side of the semiconductor substrate, further comprising forming an etch stop layer.

7. The method of claim 1, further comprising forming a second barrier layer over the via and trench openings.

8. The method of claim 7, further comprising forming a second seed layer over the second barrier layer.

9. The method of claim 1, wherein the interconnect structure is formed by electro-chemical plating.

10. The method of claim 1, wherein the TSV and interconnect structure comprise copper or copper alloys.

11. The method of claim 1, after the forming the interconnect structure, further comprising planarizing the first side of the semiconductor substrate.

12. A method of forming an interposer, comprising:

providing a semiconductor substrate, the semiconductor substrate having a front surface and a back surface opposite the front surface;

forming one or more through-silicon vias (TSVs) extending from the front surface into the semiconductor substrate;

forming an inter-layer dielectric (ILD) layer overlying the front surface of the semiconductor substrate and the one or more TSVs; and forming an interconnect structure having a first partition and a second partition, the first partition formed in the ILD layer and the second partition formed in a portion of the semiconductor substrate, *wherein the second partition has straight sidewalls extending from the first partition to a bottom of the second partition and* wherein the interconnect structure electrically connecting the one or more TSVs to the semiconductor substrate.

13. The method of claim 12, further comprising forming a liner layer between at least the one or more TSVs and the semiconductor substrate.

14. The method of claim 13, further comprising forming a barrier layer and/or a seed layer between the one or more TSVs and the liner layer.

15. The method of claim 12, further comprising forming a barrier layer and/or seed layer between at least the interconnect structure and the ILD layer and the front surface of the semiconductor substrate.

16. An integrated circuit structure, comprising:

a semiconductor substrate having a front surface and a back surface opposite the front surface;

a through-silicon via (TSV) formed extending from the front surface of the semiconductor substrate into the semiconductor substrate; and an interconnect structure having a first partition and a second partition, the first partition formed in an inter-layer dielectric (ILD) layer, the ILD layer overlying the front surface of the semiconductor substrate, and the second partition formed in a portion of the semiconductor substrate *and having straight sidewalls from a top surface of the semiconductor substrate to a bottom surface of the second partition*, wherein the interconnect structure electrically connects the TSV to the semiconductor substrate.

17. The integrated circuit structure of claim 16, wherein the integrated circuit structure is an interposer.

18. The integrated circuit structure of claim 16, further comprising a liner layer formed at least between the TSV and the semiconductor substrate.

19. The integrated circuit structure of claim 18, further comprising:

a barrier layer formed between the TSV and the liner layer; and a seed layer formed between the TSV and the barrier layer.

20. The integrated circuit structure of claim 16, wherein the interconnect structure and the TSV are formed of the same conductive material.

21. The integrated circuit structure of claim 17, wherein the interposer comprises passive devices.

22. The integrated circuit structure of claim 21, wherein the interposer comprises active devices.

23. An interposer, comprising:

a semiconductor substrate having a front surface and a back surface opposite the front surface;

a through-silicon via (TSV) formed extending from the front surface of the semiconductor substrate into the semiconductor substrate;

a liner layer formed at least between the TSV and the semiconductor substrate;

an inter-layer dielectric (ILD) layer formed over the front surface of the semiconductor substrate; and an interconnect structure having a first partition and a second partition, the first partition formed in the ILD layer and the second partition formed in a portion of the semiconductor substrate, wherein the interconnect structure electrically connects the TSV to the semiconductor substrate *and wherein the second partition has straight sidewalls as the second partition extends into the semiconductor substrate to a bottom surface of the second partition.*

24. The interposer of claim 23, further comprising a barrier layer formed between the TSV and the liner layer.

25. The interposer of claim 24, further comprising a seed layer formed between the TSV and the barrier layer.

26. The interposer of claim 23, wherein the interconnect structure and the TSV are formed of the same conductive material.

27. The interposer of claim 23, further comprising passive devices.

28. The interposer of claim 27, further comprising active devices.

29. A semiconductor package structure, comprising:

an interposer having:

a semiconductor substrate having a front surface and a back surface opposite the front surface;

a through-silicon via (TSV) formed extending from the front surface of the semiconductor substrate into the semiconductor substrate;

a liner layer formed at least between the TSV and the semiconductor substrate;

an inter-layer dielectric (ILD) layer formed over the front surface of the semiconductor substrate; and an interconnect structure having a first partition and a second partition, the first partition formed in the ILD layer and the second partition formed in a portion of the semiconductor substrate, wherein the interconnect structure electrically connects the TSV to the semiconductor substrate, *wherein a straight sidewall of the second partition extends from a bottom of the second partition to a surface of the semiconductor substrate facing the first partition*;

a semiconductor chip; and a plurality of bonding pads bonding the semiconductor chip to the interposer.

30. The semiconductor package structure of claim 29, further comprising an additional semiconductor chip bonded onto the semiconductor chip.

31. The semiconductor package structure of claim 29, wherein the interposer comprises passive devices.

32. The semiconductor package structure of claim 31, wherein the interposer further comprises active devices.

33. A semiconductor package structure, comprising:

an interposer having:

a semiconductor substrate having a front surface and a back surface opposite the front surface;

a through-silicon via (TSV) formed extending from the front surface of the semiconductor substrate into the semiconductor substrate;

a liner layer formed at least between the TSV and the semiconductor substrate;

an inter-layer dielectric (ILD) layer formed over the front surface of the semiconductor substrate; and an interconnect structure having a first partition and a second partition, the first partition formed in the ILD layer and the second partition formed in a portion of the semiconductor substrate, wherein the interconnect structure electrically connects the TSV to the semiconductor substrate, *the second partition having a straight sidewall through the semiconductor substrate*;

a multi-chip semiconductor structure having at least a first chip and a second chip; and a plurality of bonding pads bonding the multi-chip semiconductor structure to the interposer.

34. The semiconductor package structure of claim 33, wherein the interposer comprises passive devices.

35. The semiconductor package structure of claim 34, wherein the interposer further comprises active devices.

*36. An integrated circuit structure, comprising:*

*a semiconductor substrate having a front surface and a back surface opposite the front surface;*

*a through via (TV) formed in the semiconductor substrate;*

*a liner layer formed at least between the TV and the semiconductor substrate; and*

*an interconnect structure having a first partition and a second partition, the first partition formed in an inter-layer dielectric (ILD) layer, the ILD layer overlying the front surface of the semiconductor substrate, and the second partition formed with straight sidewalls in a portion of the semiconductor substrate, wherein the interconnect structure electrically connects the TV to the semiconductor substrate.*

*37. The integrated circuit structure of claim 36, wherein the integrated circuit structure is an interposer.*

*38. The integrated circuit structure of claim 36, further comprising: a first barrier layer formed between the TV and the liner layer; and a seed layer formed between the TV and the first barrier layer.*

*39. The integrated circuit structure of claim 38, wherein the interconnect structure comprises a second barrier layer.*

*40. The integrated circuit structure of claim 39, wherein the second barrier layer is in contact with a top surface of TV.*

*41. The integrated circuit structure of claim 39, wherein the second barrier layer is in contact with the first barrier layer.*

*42. The integrated circuit structure of claim 36, wherein the interconnect structure and the TV are formed of the same conductive material.*

*43. The integrated circuit structure of claim 37, wherein the interposer comprises passive devices.*

*44. The integrated circuit structure of claim 43, wherein the interposer comprises active devices.*

*45. The integrated circuit structure of claim 36, wherein the TV is grounded.*

*46. The integrated circuit structure of claim 36, further comprising another TV in the semiconductor substrate and being insulated from the semiconductor substrate by the liner layer.*

*47. The integrated circuit structure of claim 36, wherein the liner layer located between the ILD layer and the front surface of the semiconductor substrate is conformal.*

*48. An interposer, comprising:*

*a semiconductor substrate having a front surface and a back surface opposite the front surface;*

*a through via (TV) formed in the semiconductor substrate;*

*a liner layer formed at least between the TV and the semiconductor substrate;*

*an inter-layer dielectric (ILD) layer formed over the front surface of the semiconductor substrate;*

*an interconnect structure having a first partition and a second partition, the first partition formed in the ILD layer and the second partition formed in a portion of the semiconductor substrate, wherein the interconnect structure electrically connects the TV to the semiconductor substrate, wherein the second partition has straight sidewalls within the semiconductor substrate.*

*49. The interposer of claim 48, further comprising a first barrier layer formed between the TV and the liner layer.*

*50. The interposer of claim 49, further comprising a seed layer formed between the TV and the first barrier layer.*

*51. The integrated circuit structure of claim 49, wherein the second liner comprises a second barrier layer.*

*52. The integrated circuit structure of claim 51, wherein the second barrier layer is in contact with a top surface of TV.*

*53. The integrated circuit structure of claim 51, wherein the second barrier layer is in contact with the first barrier layer.*

*54. The interposer of claim 48, wherein the interconnect structure and the TV are formed of the same conductive material.*

*55. The interposer of claim 48, further comprising passive devices.*

*56. The interposer of claim 55, further comprising active devices.*

*57. The integrated circuit structure of claim 48, wherein the TV is grounded.*

*58. The integrated circuit structure of claim 48, further comprising another TV in the semiconductor substrate and being insulated from the semiconductor substrate by the liner layer.*

*59. The integrated circuit structure of claim 48, wherein the liner layer comprises a portion between the ILD layer and the front surface of the semiconductor substrate.*

*60. A semiconductor package structure, comprising:*

*an interposer having:*

*a semiconductor substrate having a front surface and a back surface opposite the front surface;*

*a through via (TV) formed in the semiconductor substrate;*

*a liner layer formed at least between the TV and the semiconductor substrate;*

*a dielectric layer formed over the front surface of the semiconductor substrate; and an interconnect structure having a first partition and a second partition, the first partition formed in the dielectric layer and the second partition formed in a portion of the semiconductor substrate, wherein the interconnect structure electrically connects the TV to the semiconductor substrate, the second partition extends into the semiconductor substrate a first length, the second partition having a straight sidewall along the first length; and*

*a semiconductor chip bonded to the interposer.*

*61. The semiconductor package structure of claim 60, further comprising an additional semiconductor chip bonded onto the semiconductor chip.*

*62. The semiconductor package structure of claim 60, wherein the interposer comprises passive devices.*

*63. The semiconductor package structure of claim 62, wherein the interposer further comprises active devices.*

*64. The integrated circuit structure of claim 60, wherein the semiconductor chip is bonded to the interposer through a plurality of bonding pads.*

*65. The integrated circuit structure of claim 60, wherein the TV is grounded.*

*66. The integrated circuit structure of claim 60, further comprising another TV in the semiconductor substrate and being insulated from the semiconductor substrate by the liner layer.*

*67. The integrated circuit structure of claim 60, wherein the liner layer comprises a portion between the dielectric layer and the front surface of the semiconductor substrate.*

*68. A semiconductor package structure, comprising:*

*an interposer having:*

*a semiconductor substrate having a front surface and a back surface opposite the front surface;*

*a through via (TV) in the semiconductor substrate;*

*a liner layer formed at least between the TV and the semiconductor substrate;*

*a dielectric layer formed over the front surface of the semiconductor substrate; and*

*an interconnect structure having a first partition and a second partition, the first partition formed in the dielectric layer and the second partition formed with straight sidewalls extending into a portion of the semiconductor substrate, the straight sidewalls extending from a first side of the second partition to a second side of the second partition opposite the first side of the partition, wherein the interconnect structure electrically connects the TV to the semiconductor substrate; and*

*a multi-chip semiconductor structure having at least a first chip and a second chip, wherein at least one of the first chip and the second chip is bonded to the interposer.*

*69. The semiconductor package structure of claim 68, wherein the interposer comprises passive devices.*

*70. The semiconductor package structure of claim 69, wherein the interposer further comprises active devices.*

*71. The integrated circuit structure of claim 68, wherein the first chip is bonded to the interposer through a plurality of bonding pads.*

*72. The integrated circuit structure of claim 68, wherein the TV is grounded.*

*73. The integrated circuit structure of claim 68, further comprising another TV in the semiconductor substrate and being insulated from the semiconductor substrate by the liner layer.*

*74. The integrated circuit structure of claim 68, wherein the second chip is bonded onto the first chip.*

* * * * *